United States Patent
Jin et al.

(10) Patent No.: US 12,279,454 B2
(45) Date of Patent: Apr. 15, 2025

(54) ZERO EXPANSION IN A REPLACEMENT METAL GATE PROCESS WITH A SPACER

(71) Applicant: International Business Machines Corporation, Armonk, NY (US)

(72) Inventors: Youseung Jin, Ballston Spa, NY (US); Elnatan Mataev, Poughkeepsie, NY (US); Jonathan Fry, Fishkill, NY (US); Dominic Rossillo, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 716 days.

(21) Appl. No.: 17/482,731

(22) Filed: Sep. 23, 2021

(65) Prior Publication Data

US 2023/0092313 A1  Mar. 23, 2023

(51) Int. Cl.
| | | |
|---|---|---|
| H01L 29/49 | (2006.01) | |
| H01L 29/66 | (2006.01) | |
| H01L 29/78 | (2006.01) | |
| H10B 10/00 | (2023.01) | |
| H10D 30/01 | (2025.01) | |
| H10D 30/62 | (2025.01) | |
| H10D 64/01 | (2025.01) | |
| H10D 64/66 | (2025.01) | |

(52) U.S. Cl.
CPC .......... *H10D 64/017* (2025.01); *H10B 10/12* (2023.02); *H10B 10/18* (2023.02); *H10D 30/024* (2025.01); *H10D 30/62* (2025.01); *H10D 64/671* (2025.01)

(58) Field of Classification Search
CPC ........... H01L 29/4983; H01L 29/66545; H01L 29/66795; H01L 29/785; H10B 10/12; H10B 10/18; H01D 30/024; H01D 30/62

USPC .......................................................... 257/401
See application file for complete search history.

(56) References Cited

U.S. PATENT DOCUMENTS

| | | |
|---|---|---|
| 7,821,050 B1 | 10/2010 | Liu et al. |
| 9,589,851 B2 | 3/2017 | Bu et al. |
| 9,601,335 B2 | 3/2017 | Greene et al. |
| 10,403,740 B2 | 9/2019 | Basker et al. |
| 10,522,409 B2 | 12/2019 | Tsai et al. |
| 10,734,233 B2 | 8/2020 | Zang et al. |
| 10,872,979 B2 | 12/2020 | Zang et al. |
| 11,088,337 B2 * | 8/2021 | Vasen ................... H10K 10/84 |
| 2015/0249036 A1 | 9/2015 | Cai et al. |
| 2017/0117380 A1 | 4/2017 | Lu et al. |
| 2022/0310455 A1 * | 9/2022 | Huang ............... H01L 21/7682 |

OTHER PUBLICATIONS

Wikipedia, "Hydrochloric Acid", last edited on Sep. 22, 2021, 10 pages.

(Continued)

*Primary Examiner* — Monica D Harrison
(74) *Attorney, Agent, or Firm* — Scully, Scott, Murphy & Presser, P.C.; L. Jeffrey Kelly, Esq

(57) ABSTRACT

Zero expanded functional gate structures are formed by utilizing a dipole material spacer as a means to prevent expanded void formation during a replacement metal gate process. Notably, the dipole material spacer prevents expanded void formation into the dielectric spacer thus preventing the functional gate structures from being in direct physical contact with the source/drain regions. Improvement in yield loss and reliability is thus provided utilizing a dipole material spacer during a replacement metal gate process.

20 Claims, 10 Drawing Sheets

(56) References Cited

OTHER PUBLICATIONS

Dhungana, S., et al., "Boron and high-k dielectrics: Possible fourth etch stop colors for multipattern optical lithography processing", Journal of Vacuum Science and Technology A, American Vacuum Society, Jan. 2017, 35 pages (2).

Chung, K. H., et al., "Chlorine Etching For In-Situ Low-Temperature Silicon Surface Cleaning For Epitaxy Applications", ECS Transactions, ECS, Apr. 2007, 7 pages.

Garnier et al. "Lanthanum Interaction with Surface Preparations", 2013 ECS—The Electrochemical Society, 2013, 7 Pages, vol. 58, No. 6.

Tonotani Junichi , "Selective dry etching of La2O3/Si stacked film." International Workshop on Nano CMOS, 2006, p. 278.

* cited by examiner

ZERO EXPANSION IN A REPLACEMENT METAL GATE PROCESS WITH A SPACER

BACKGROUND

The present application relates to semiconductor technology, and more particularly to a semiconductor structure including a replacement metal gate that has zero metal gate expansion.

In a replacement metal gate process (or gate last process), a sacrificial gate structure including dielectric spacers are formed on a surface of a semiconductor material, such as, for example, a semiconductor fin. After forming source/drain regions on, or within, the semiconductor material, the sacrificial gate structure is removed providing a gate cavity in which a functional gate structure (i.e., replacement metal gate) will be subsequently formed.

In conventional replacement metal gate processes, an expanded void is formed which extends laterally outwards from a lower portion of the gate cavity, through an entirety of the dielectric spacer and into a portion of the interlayer dielectric material layer such that the source/drain regions are physically exposed. Thus, and during the replacement of the sacrificial gate structure with the functional gate structure, the functional gate structure extends into the expanded void, is present beneath the dielectric spacers and contacts a surface of the source/drain regions.

The expanded void formation mentioned above provides unwanted yield loss and can result in device reliability issues. There is thus a need for eliminating the formation of the expanded void during a replacement metal gate process.

SUMMARY

Zero expanded functional gate structures are formed by utilizing a dipole material spacer as a means to prevent expanded void formation during a replacement metal gate process. Notably, the dipole material spacer prevents expanded void formation into the dielectric spacer thus preventing the functional gate structures from being in direct physical contact with the source/drain regions. Improvement in yield loss and reliability is thus provided utilizing a dipole material spacer during a replacement metal gate process.

In one aspect of the present application, a semiconductor structure is provided. In one embodiment of the present application, the semiconductor structure includes a functional gate structure located on a semiconductor channel material structure, wherein the functional gate structure has an outermost sidewall that is substantially perpendicular relative to a planar horizontal surface of the semiconductor channel material structure. Source/drain regions are located on a surface of the semiconductor channel material structure and on either side of the functional gate structure. A dielectric spacer is located laterally adjacent to the functional gate structure, wherein the dielectric spacer has a vertical sidewall facing the outermost sidewall of the functional gate structure and wherein the dielectric spacer entirely separates the functional gate structure from the source/drain regions. The structure of this embodiment further includes a dipole material spacer located between the outermost sidewall of the functional gate structure and the dielectric spacer.

In another embodiment of the present application, the semiconductor structure includes a functional gate structure located on a semiconductor channel material structure, wherein the functional gate structure has an outermost sidewall that is substantially perpendicular relative to a planar horizontal surface of the semiconductor channel material structure. Source/drain regions are located on a surface of the semiconductor channel material structure and on either side of the functional gate structure. A dielectric spacer is located laterally adjacent to the functional gate structure, wherein the dielectric spacer has a vertical sidewall facing the outermost sidewall of the functional gate structure and wherein the dielectric spacer entirely separates the functional gate structure from the source/drain regions. The structure of this embodiment further includes a trace amount of a dipole material present along the vertical sidewall of the dielectric spacer facing the outermost sidewall of the functional gate structure.

In either embodiment, the functional gate structure is present in a first device region, e.g., an I/O device region, and a second device region, e.g., a core logic/SRAM device region, can also be present that is spaced apart from the first device region. When present, the second device region can include a second functional gate structure located on a second semiconductor channel material structure, wherein the second functional gate structure has an outermost sidewall that is substantially perpendicular relative to a planar horizontal surface of the second semiconductor channel material structure, second source/drain regions located on a surface of the second semiconductor channel material structure and on either side of the second functional gate structure, a second dielectric spacer located laterally adjacent to the second functional gate structure, wherein the second dielectric spacer has a vertical sidewall facing the outermost sidewall of the second functional gate structure and wherein the second dielectric spacer entirely separates the second functional gate structure from the second source/drain regions, and wherein a trace amount of a dipole material is located at an interface between the outermost sidewall of the second functional gate structure and the second dielectric spacer.

In yet another embodiment, the semiconductor structure includes a functional gate structure located on a semiconductor channel material structure, wherein the functional gate structure has an outermost sidewall that is substantially perpendicular relative to a planar horizontal surface of the semiconductor channel material structure. Source/drain regions are located on a surface of the semiconductor channel material structure and on either side of the functional gate structure. A dielectric spacer is located laterally adjacent to the functional gate structure, wherein the dielectric spacer has a vertical sidewall facing the outermost sidewall of the functional gate structure and wherein the dielectric spacer entirely separates the functional gate structure from the source/drain regions. In this embodiment, a trace amount of a dipole material is located at an interface between the outermost sidewall of the functional gate structure and the dielectric spacer.

In addition to providing semiconductor structures, the present application also provides methods of forming such semiconductor structures. Such methods include the use of a dipole material spacer to prevent expanded void formation which, if formed, would permit the functional gate structure to directly contact the source/drain regions. Such direct contact between the functional gate structure and the source/drain regions results in unwanted product yield loss and device reliability issues. The methods of the present application will become more apparent from the following drawings and detailed discussion.

DETAILED DESCRIPTION

Figure 1A:
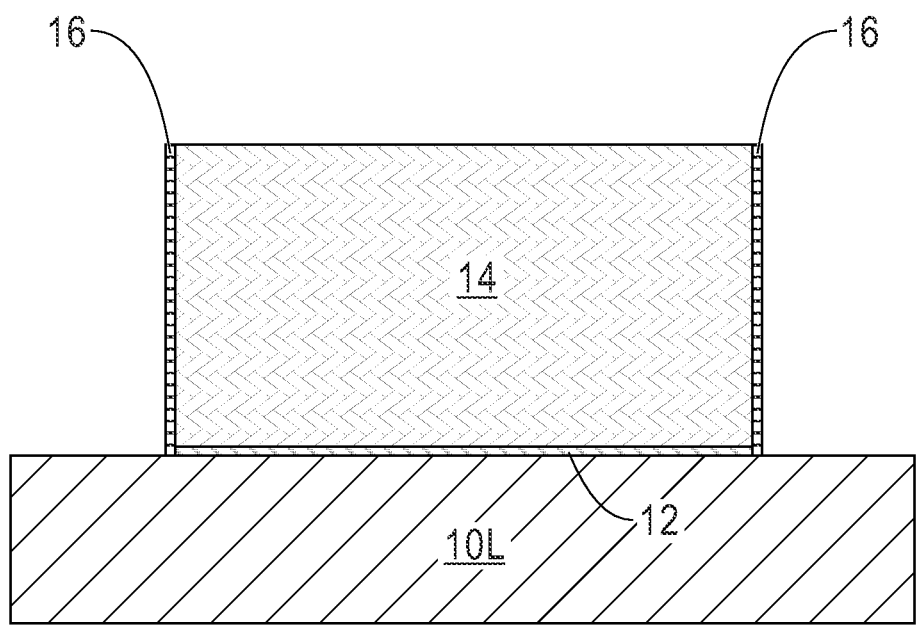
FIG. 1A is a cross sectional view illustrating an exemplary structure that is present in a I/O device region, wherein the exemplary structure includes a sacrificial gate structure located on a surface of a semiconductor fin, and a dipole material spacer located along a sidewall of the sacrificial gate structure, wherein the sacrificial gate structure includes a sacrificial gate dielectric material and a sacrificial gate material.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

In the present application, drawings are provided illustrating an exemplary structure in an I/O device region and an exemplary structure in a core logic/SRAM device region during different processing steps of the present application. Each of the drawings that are provided in the present application are along a length-wise direction of a semiconductor fin. FIGS. 1A, 2A, 3A, 4A, 5A, 6A, 7A, 8A, 9A and 10A show an exemplary structure in the I/O device region during different processing steps of the present application, while FIGS. 1B, 2B, 3B, 4B, 5B, 6B, 7B, 8B, 9B and 10B show an exemplary structure in the core logic/SRAM device region during different processing steps of the present application. While both device regions are described and illustrated, the present application works in embodiments in which only one of the device regions, i.e., I/O or core logic/SRAM, is present. The I/O device region can be present at a same level as the core logic/SRAM device region and the two device regions can be located laterally adjacent to each other, or the two device regions can be spaced apart from each other by other active and non-active device regions.

In the present application, a semiconductor fin is described and illustrated as being a semiconductor channel material structure in which a functional gate structure will be subsequently formed thereon utilizing the replacement metal gate process of the present application. Although the present application describes and illustrates the use of semiconductor fins, the present application contemplates embodiments in which other semiconductor channel material structures including, for example, a planar semiconductor substrate (bulk or semiconductor-on-insulator (SOI)), semiconductor nanowires (stacked or non-stacked), or a vertical stack of suspended semiconductor nanosheets, are employed instead of the semiconductor fins.

Figure 1B:
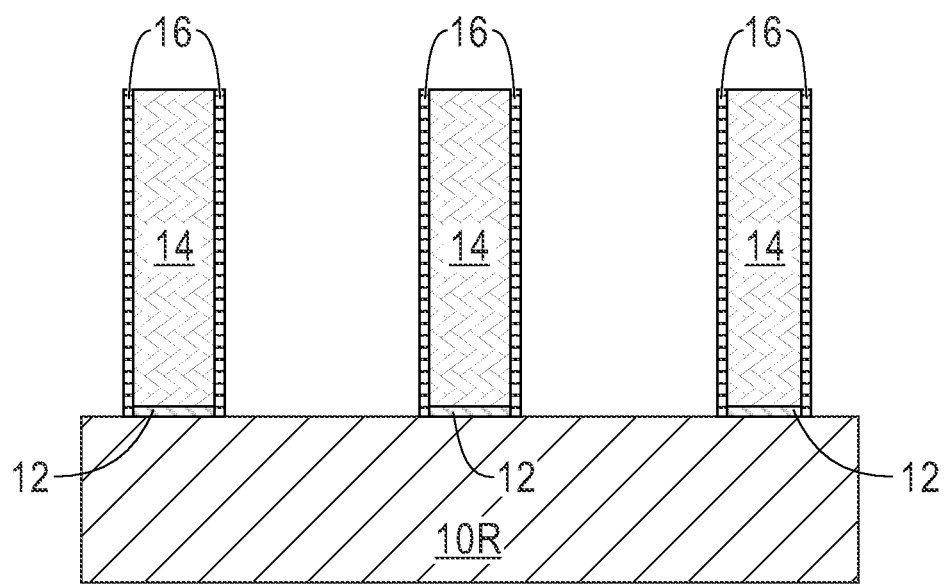
FIG. 1B is a cross sectional view illustrating an exemplary structure that is present in a core logic/SRAM device region, wherein the exemplary structure includes sacrificial gate structures located on a surface of a semiconductor fin, and a dipole material spacer located along a sidewall of each of the sacrificial gate structures, wherein each sacrificial gate structure includes a sacrificial gate dielectric material and a sacrificial gate material.

Referring first to FIGS. 1A and 1B, there are illustrated exemplary structures that are present in a I/O device region and a core logic/SRAM device region, respectively, that can be employed in accordance with an embodiment of the present application. Notably, the exemplary structure shown in FIG. 1A, which is present in the I/O device region, includes a sacrificial gate structure 12/14 located on a surface of a semiconductor fin 10L, and a dipole material spacer 16 located along a sidewall of the sacrificial gate structure 12/14. Although a single sacrificial gate structure 12/14 is shown in FIG. 1A, a plurality of sacrificial gate structures 12,14 can be present in the I/O device region.

The exemplary structure shown in FIG. 1B, which is present in the core logic/SRAM device region, includes a plurality of sacrificial gate structures 12/14 located on a surface of a semiconductor fin 10R, and a dipole material spacer 16 located along a sidewall of the sacrificial gate structure 12/14. Although a plurality of sacrificial gate structures 12/14 are shown in the core logic/SRAM device region, the present application contemplates an embodiment in which a single sacrificial gate structure 12/14 is formed in the core logic/SRAM device region.

Although not shown, semiconductor fin 10L and semiconductor fin 10R are formed on a surface of a substrate. In some embodiments (not shown), the substrate is composed of a semiconductor material such as, for example, silicon (Si), a silicon germanium (SiGe) alloy, a silicon germanium carbide (SiGeC) alloy, germanium (Ge), III/V compound semiconductors, II/VI compound semiconductors or a multilayered stack including at least two different semiconductor materials. In other embodiments, the substrate is composed of at least a dielectric material such as, for example, silicon dioxide and/or boron nitride.

Semiconductor fin 10L and semiconductor fin 10R are not typically adjoined to each other; that is, semiconductor fin 10L is spaced apart from semiconductor fin 10R. Each semiconductor fin 10L, 10R refers to a semiconductor channel material structure that is composed of one of the semiconductor materials mentioned above for the substrate. In the present application, the term "semiconductor fin" denotes a semiconductor material containing structure that includes a pair of vertical sidewalls that are parallel to each other. A surface is "vertical" if there exists a vertical plane from which the surface does not deviate by more than three times the root mean square roughness of the surface. In one embodiment, each semiconductor fin 10L, 10R has a height from 20 nm to 200 nm, a width from 5 nm to 30 nm, and a length from 20 nm to 200 nm. Other heights and/or widths and/or lengths that are lesser than, or greater than, the ranges mentioned herein can also be used in the present application. Although the cross sectional views only illustrate a single semiconductor fin 10L, 10R in the two device regions, the two device regions (i.e., I/O and core logic/SRAM) can include a plurality of spaced apart semiconductor fins. Each semiconductor fin of a plurality of semiconductor fins are aligned parallel to one another.

The semiconductor fin 10L, 10R can be formed by patterning an upper portion of a bulk semiconductor substrate (i.e., a substrate composed entirely of at least one semiconductor material), or by patterning a top semiconductor layer of a semiconductor-on-insulator (SOI) substrate; an SOI substrate includes a dielectric material (e.g., silicon dioxide and/or boron nitride) sandwiched between a bottom semiconductor layer and a top semiconductor material. Patterning may be performed by lithography and etching, a sidewall image transfer (SIT) process or by direct self-assembly (DSA) process in which a copolymer that is capable of direct self-assembly is used.

Each sacrificial gate structure 12/14 regardless of the device region that it is present in, includes a sacrificial gate dielectric material 12 and a sacrificial gate material 14. In some embodiments (not shown), each sacrificial gate structure can include a hard mask cap located on the sacrificial gate material 14. The sacrificial gate dielectric material 12 can be composed of a dielectric material such as, for example, silicon dioxide. The sacrificial gate material 14 can include, but is not limited to, polysilicon, amorphous silicon, amorphous silicon germanium, tungsten, titanium, tantalum, aluminum, nickel, ruthenium, palladium, platinum, or alloys of such metals. If present, the hard mask cap can be composed of a hard mask material such as, for example, silicon dioxide, silicon nitride, silicon oxynitride or any multilayered combination thereof. The sacrificial gate structures can be formed by depositing the various material layers that provide the sacrificial gate structures and then patterning these various deposited material layers by lithography and etching. Each sacrificial gate structure is oriented perpendicular to the semiconductor fins that are present in each device region. When a plurality of sacrificial gate structures are formed, each sacrificial gate structure is oriented parallel to each other, yet perpendicular to the semiconductor fins that are present in the device regions. Although not shown, the sacrificial gate structures straddling over at least one semiconductor fin. By "straddling over" it is meant that the sacrificial gate structure is located on opposing sidewalls and atop the semiconductor fin 10L, 10R.

FIGS. 1A and 1B also illustrate a dipole material spacer 16 present along a sidewall of the sacrificial gate structures 12/14 that are present in both device regions. The dipole material spacers 16 are composed of a dielectric material that has a dipole moment. In one embodiment of the present application, the dipole material that can be used in providing the dipole material spacers 16 includes a transition metal oxide such as, for example, lanthanum oxide or aluminum oxide. In other embodiments, the dipole material that can be used in providing the dipole material spacers 16 includes one or more materials/elements composed of Group IIA or IIIB elements of the Periodic Table of Elements.

The dipole material spacers 16 can be formed by deposition of the dipole material and thereafter subjecting the deposited dipole material to a spacer etch. The depositing of the dipole material can include chemical vapor deposition (CVD), plasma enhanced chemical vapor deposition (PECVD), physical vapor deposition (PVD) or atomic layer deposition (ALD). The spacer etch can include a reactive ion etch (RIE). In one embodiment, the RIE includes argon sputtering with or without $Cl_2$, $BCl_2$ or $CF_4$. Each dipole material spacer 16 has a first sidewall that contacts a sidewall of the sacrificial gate structure and a second sidewall, opposite the first sidewall, that is physically exposed at this point of the present application. The dipole material spacers 16 have a pillar shape, with vertical sidewalls, and can have a height that is the same as, or different from, a height of the sacrificial gate structures.

Figure 10A:
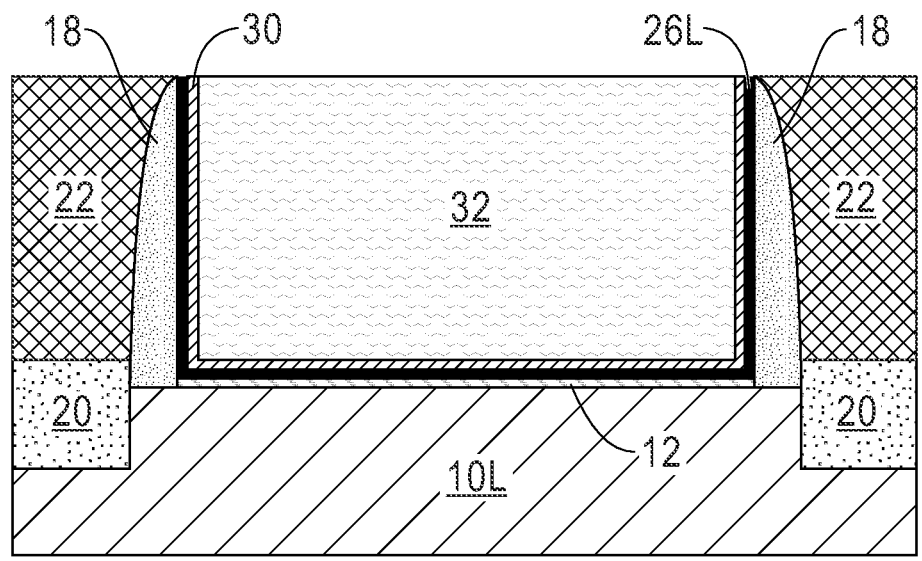
FIG. 10A is a cross sectional view of an exemplary structure in which the dipole material is removed from the I/O device region.

In some embodiments of the present application and within the I/O device region (not shown in this embodiment, but used in forming the exemplary structure shown in FIG. 10A), the dipole material spacers 16 can be removed from the I/O device region by protecting the core logic/SRAM device region with a protect mask (not shown), and then removing the dipole material spacer 16 from the sidewalls of the sacrificial gate structure that is present in the I/O device region. The removal of the dipole material spacer 16 can include an etch back process. In one example, the etch back process can include etching in HCl. It is noted that the etch back process does not remove an entirety of the dipole material from along the sidewalls of the sacrificial gate structure in the I/O device region. Instead, a trace amount of the dipole material can remain randomly distributed along the sidewalls of the sacrificial gate structure in the I/O device region. In one example, 1000 ppm or less of the dipole material remains. In another example, 500 ppm or less of the dipole material remains. The trace amount of dipole material can be detected by elemental analysis including, for example, EDX or TEM. After removing the dipole material spacer 16 in the I/O device region, the protect mask can be removed from the core logic/SRAM device region utilizing conventional mask removal processes well known to those skilled in the art.

Figure 2A:
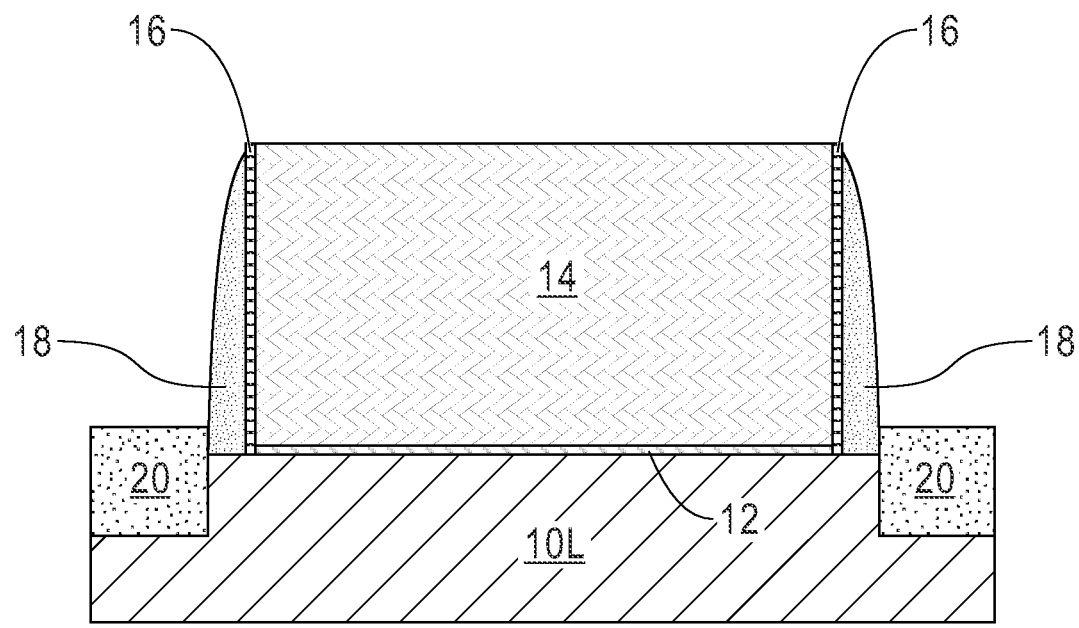
FIG. 2A is a cross sectional view of the exemplary structure shown in FIG. 1A after forming a dielectric spacer laterally adjacent to a sidewall of the dipole material spacer, and forming source/drain regions.
Figure 2B:
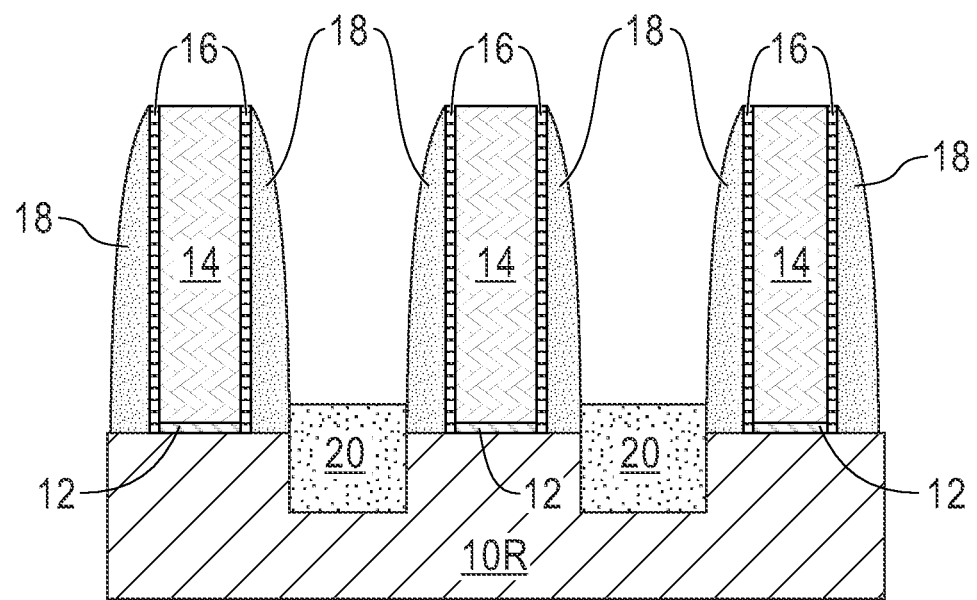
FIG. 2B is a cross sectional view of the exemplary structure shown in FIG. 1B after forming a dielectric spacer laterally adjacent to a sidewall of the dipole material spacer, and forming source/drain regions.

Referring now to FIGS. 2A and 2B, there are illustrated the exemplary structures shown in FIGS. 1A and 2A, respectively, after forming a dielectric spacer 18 laterally adjacent to a sidewall of the dipole material spacer 16, and forming source/drain regions 20. The dielectric spacer 18 (which can be referred to as a gate spacer) is formed on the second sidewall of the dipole material spacer 16 that was previously physically exposed. In the embodiment in which the dipole material spacer 16 is removed from the sacrificial gate structure in the I/O device region, the dielectric spacer 18 is formed laterally adjacent to the sidewall of the sacrificial gate structure including the trace amount of dipole material.

The dielectric spacer 18 is composed of a dielectric spacer material that is compositionally different from the dipole material that provides the dipole material spacer 16. The dielectric spacer material that provides the dielectric spacer 18 has a dielectric constant that is less than a dielectric constant of the dipole material spacer 16. The dielectric constant of the dielectric spacer material that provides the dielectric spacer is typically less than 4.0. All dielectric constants mentioned herein are measured relative to a vacuum unless otherwise stated. An illustrated dielectric spacer material that can be used in providing the dielectric spacers 18 include, but are not limited to, a dielectric material including atoms of Si, B, C and N. Other dielectric materials can be used besides a dielectric material including atoms of Si, B, C and N. The dielectric spacers 18 can be formed by deposition of a dielectric spacer material, followed by a spacer etch. The deposition of the dielectric spacer material can include, but is not limited to, CVD, PECVD, PVD, or evaporation. The spacer etch can include RIE. The dielectric spacer 18 typically has a lower portion that has a width that is greater than a width of an upper portion. The dielectric spacer 18 has a first vertical sidewall contacting the second sidewall of the dipole material spacer 16 (if present) or the sidewall of the sacrificial gate structure (if the dipole material spacer 16 is not present), and a second sidewall, opposite the first sidewall, that curves outward from a topmost surface of the dielectric spacer 18 to a bottommost surface of the dielectric spacer 18.

Next, source/drain regions 20 are formed on a surface of the semiconductor fin 10L, 10R. As used herein, a "source/drain region" can be a source region or a drain region depending on subsequent wiring and application of voltages during operation of the transistor. The source/drain regions 20 are composed of a semiconductor material, as defined above, and a p-type dopant or an n-type dopant. Typically, but not necessarily always, the source/drain regions 20 are composed of a same semiconductor material as the semiconductor fins 10L, 10R. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, the source/drain regions may have a dopant concentration of from $4 \times 10^{20}$ atoms/cm$^3$ to $3 \times 10^{21}$ atoms/cm$^3$.

In some embodiments, the source/drain regions 20 can be formed by forming source/drain trenches into the semiconductor fins 10L, 10R and thereafter filling each trench with an n-type or p-type doped semiconductor material. The filling of the source/drain trenches can include an epitaxial growth process. The term "epitaxial growth" means the growth of a second semiconductor material on a growth surface of a first semiconductor material, in which the second semiconductor material being grown has the same crystalline characteristics as the first semiconductor material. In an epitaxial deposition process, the chemical reactants provided by the source gases are controlled and the system parameters are set so that the depositing atoms arrive at the growth surface of the first semiconductor material with sufficient energy to move around on the growth surface and orient themselves to the crystal arrangement of the atoms of the growth surface. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of the of the source/drain regions 20 can be performed utilizing any well-known precursor gas or gas mixture. Carrier gases like hydrogen, nitrogen, helium and argon can be used. In some embodiments, the n-type dopant of p-type dopant is introduced into the precursor gas or gas mixture. In other embodiments, the n-type dopant of p-type dopant is introduced into an intrinsic semiconductor material that is epitaxially grown into each source/drain trench. In yet another embodiment, no source/drain trenches are formed, and the source/drain regions are epitaxially grown from source/drain trenchless semiconductor fins.

In other embodiments, the source/drain regions 20 can be formed by introducing a p-type dopant or an n-type dopant, as defined above, into portions of the semiconductor fins 10L, 10R. The dopants may be introduced into portions of the semiconductor fins 10L, 10R by ion implantation, gas phase doping, or by using a sacrificial material that contains one of the dopants mentioned above.

Figure 3A:
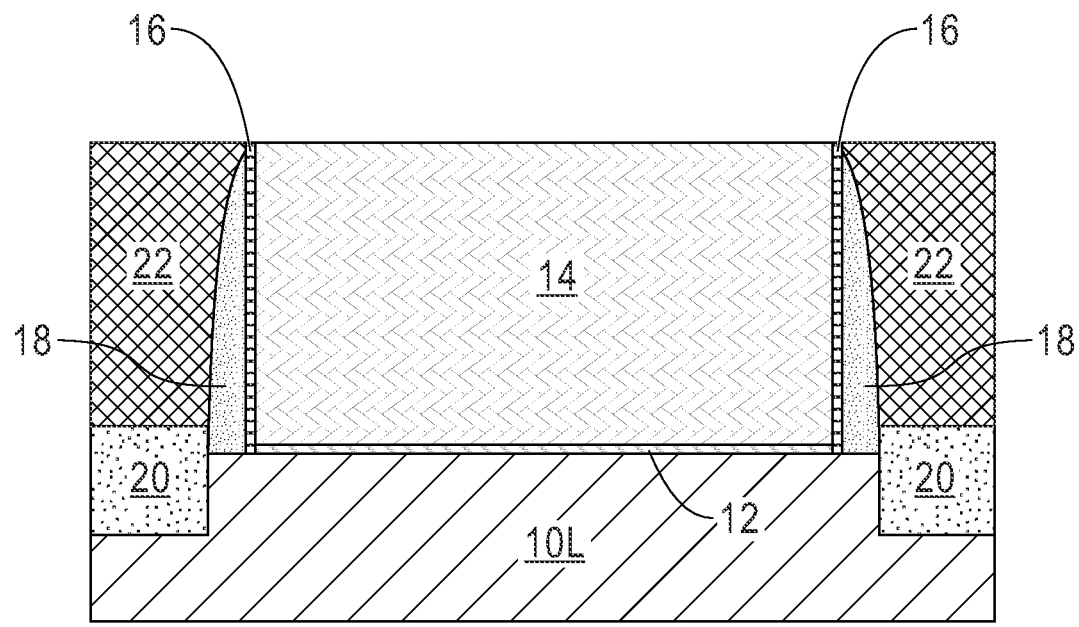
FIG. 3A is a cross sectional view of the exemplary structure shown in FIG. 2A after forming an interlayer dielectric material layer laterally adjacent to the dielectric spacer and on the source/drain regions.
Figure 3B:
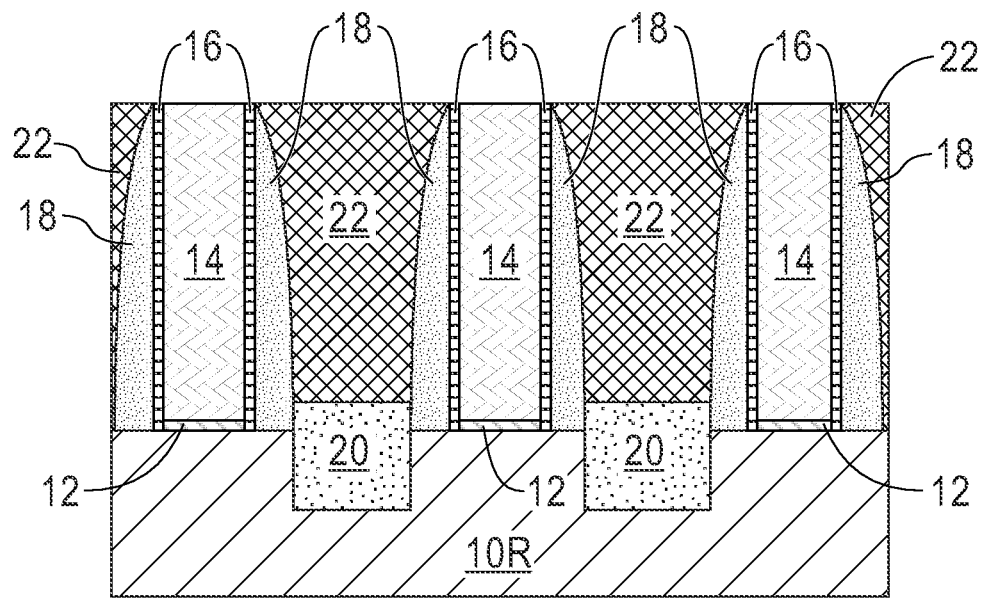
FIG. 3B is a cross sectional view of the exemplary structure shown in FIG. 2B after forming an interlayer dielectric material layer laterally adjacent to the dielectric spacer and on the source/drain regions.

Referring now to FIGS. 3A and 3B, there is illustrated the exemplary structures shown in FIGS. 2A and 2B, respectively, after forming an interlayer dielectric (ILD) material layer 22 laterally adjacent to the dielectric spacer 18 and on the source/drain regions 20. The ILD material layer 22 can have a topmost surface that is coplanar with a topmost surface of each of the dielectric spacer 18, the dipole material spacer 16, if the same is present, and the sacrificial gate structure 12, 14.

The ILD material layer 22 can be composed of a dielectric material including, for example, silicon oxide, silicon nitride, undoped silicate glass (USG), fluorosilicate glass (FSG), borophosphosilicate glass (BPSG), a spin-on low-k dielectric layer, a CVD low-k dielectric layer or any combination thereof. The term "low-k" as used throughout the present application denotes a dielectric material that has a dielectric constant of less than 4.0. Although not shown, the ILD material layer 22 can include a multilayered structure that includes at least two different dielectric materials stacked one atop the other such as, for example, silicon nitride and silicon dioxide. The ILD material layer 22 can be formed by a deposition process such as, for example, CVD, PECVD, or spin-on coating. A planarization process such as, for example, chemical mechanical polishing (CMP), can be performed after the deposition of the dielectric material that provides the ILD material layer 22. The planarization process physically exposes a topmost surface of the sacrificial gate material 14 of each sacrificial gate structure 12/14. Thus, the planarization process removes each hard mask cap that can be present atop the sacrificial gate material 14; upper portions of the dielectric spacers 18 and, if present, an upper portion of the dipole material spacer 16 are also removed during the planarization process.

Figure 4A:
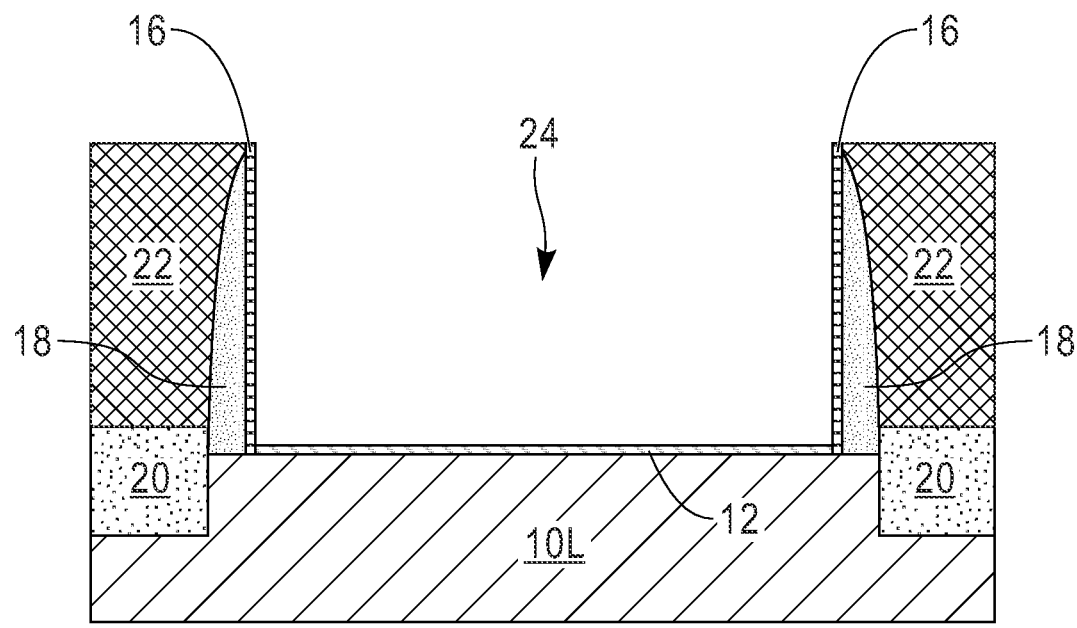
FIG. 4A is a cross sectional view of the exemplary structure shown in FIG. 3A after removing the sacrificial gate material of the sacrificial gate structure.
Figure 4B:
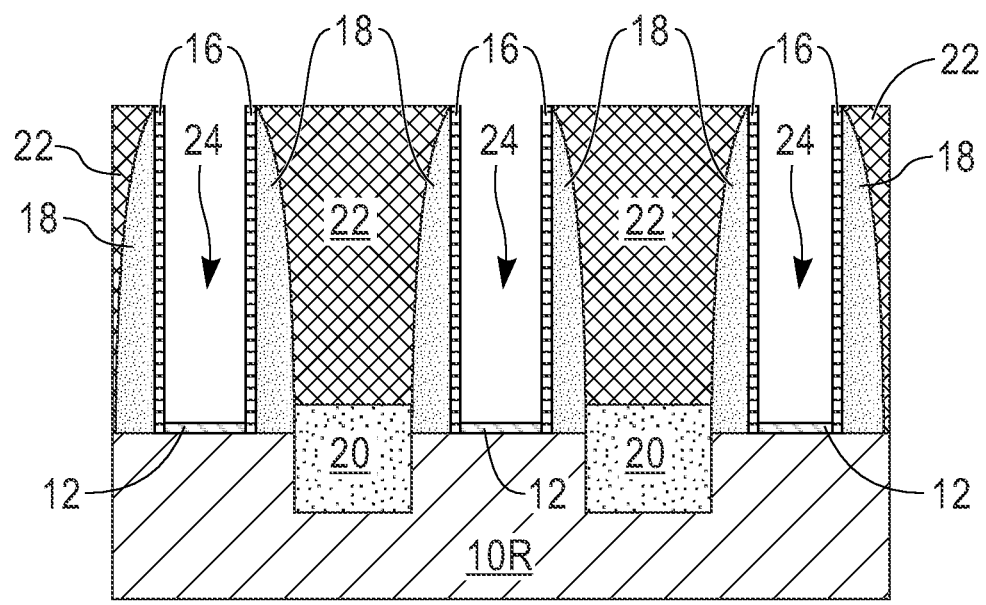
FIG. 4B is a cross sectional view of the exemplary structure shown in FIG. 3B after removing the sacrificial gate material of each sacrificial gate structure.

Referring now to FIGS. 4A and 4B, there are illustrated the exemplary structures shown in FIGS. 3A and 3B, respectively, after removing the sacrificial gate material 14 of the sacrificial gate structure. The removal of the sacrificial gate material 14 stops on a surface of the sacrificial gate material 12. The removal of the sacrificial gate material 14 includes an etching process (dry etching and/or wet chemical etching). In one example, a combination of a reactive ion etching process and a wet chemical etch can be used to remove the sacrificial gate material 14. The removal of the sacrificial gate material 14 forms an opening 24. Opening 24 can be referred to as a gate cavity. Because the dipole material spacer 16 is present in at least the core logic/SRAM device area, no expanded void is formed as in the case with prior art processes.

Figure 5A:
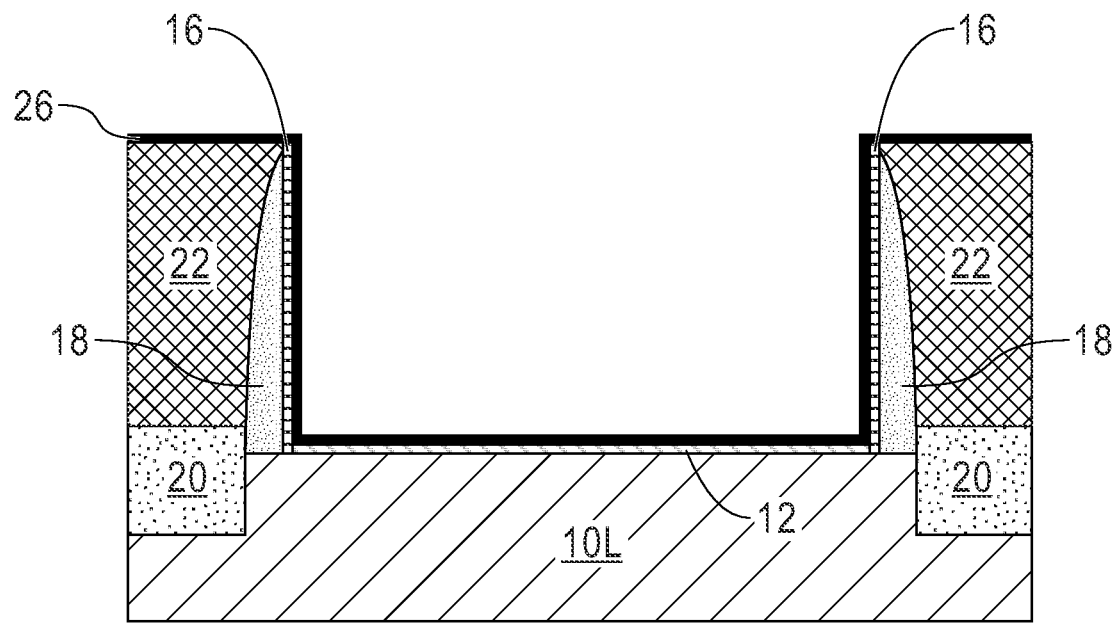
FIG. 5A is a cross sectional view of the exemplary structure shown in FIG. 4A after forming a dielectric oxide layer.
Figure 5B:
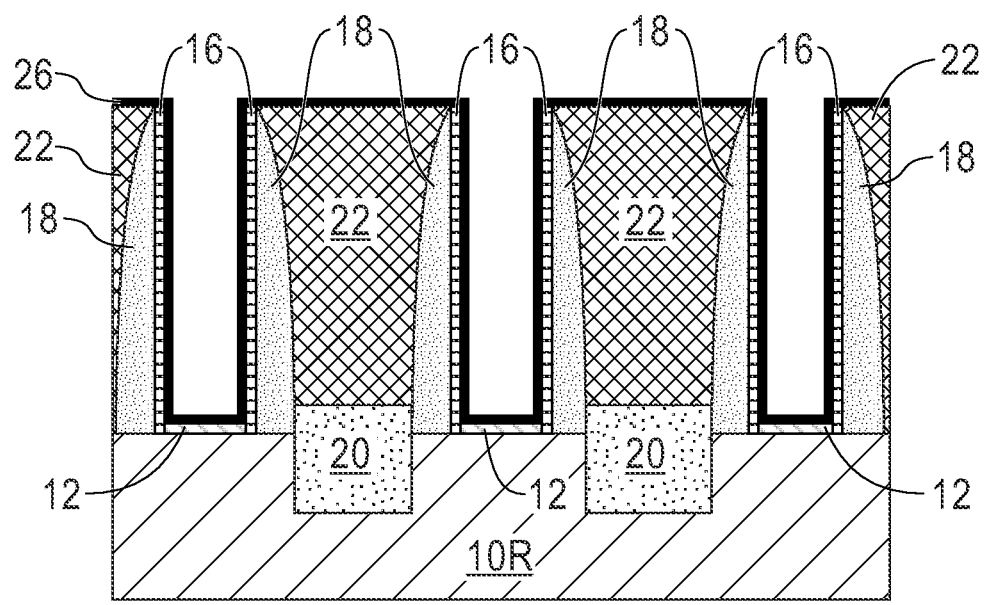
FIG. 5B is a cross sectional view of the exemplary structure shown in FIG. 4B after forming a dielectric oxide layer.

Referring now to FIGS. 5A and 5B, there are illustrated the exemplary structures shown in FIGS. 4A and 4B, respectively, after forming a dielectric oxide layer 26. The dielectric oxide layer 26 is formed atop the ILD material layer 22 and within each opening 24. In each opening 24, the dielectric oxide layer 26 lines the first sidewall of the dipole material spacer 16, if the same is present (when the dipole material spacer 16 is not present, the dielectric oxide layer 26 lines a sidewall of the dielectric spacer 18) and is present on top of the sacrificial gate dielectric material 12.

The dielectric oxide layer 26 can be composed of dielectric oxide such as, for example, silicon dioxide, germanium oxide or silicon oxynitride The dielectric oxide layer 26 can be formed by a deposition process such as, for example, CVD, PECVD, PVD or ALD. The dielectric oxide layer 26 can have various thicknesses as long as the dielectric oxide layer 26 does not completely fill in the volume of opening 24. In some embodiments, the dielectric oxide layer 26 is a conformal layer. The term "conformal layer" denotes that a layer has a vertical thickness along horizontal surfaces that is substantially the same (i.e., within ±10%) as the lateral thickness along vertical surfaces.

Figure 6A:
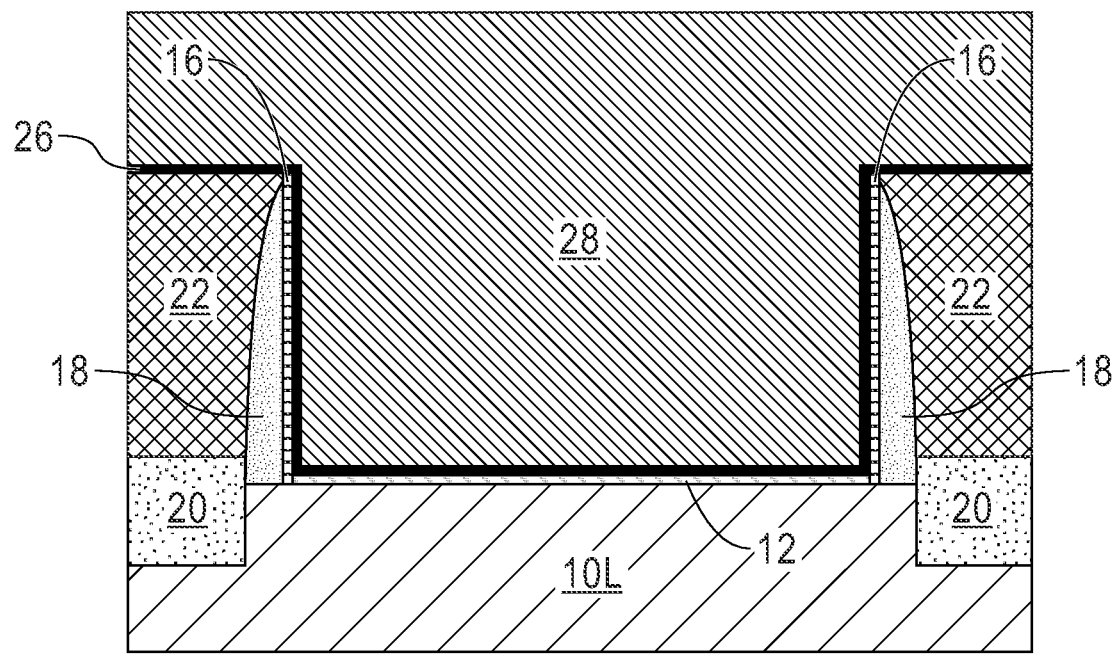
FIG. 6A is a cross sectional view of the exemplary structure show in FIG. 5A after forming a protect mask on the dielectric oxide layer.
Figure 6B:
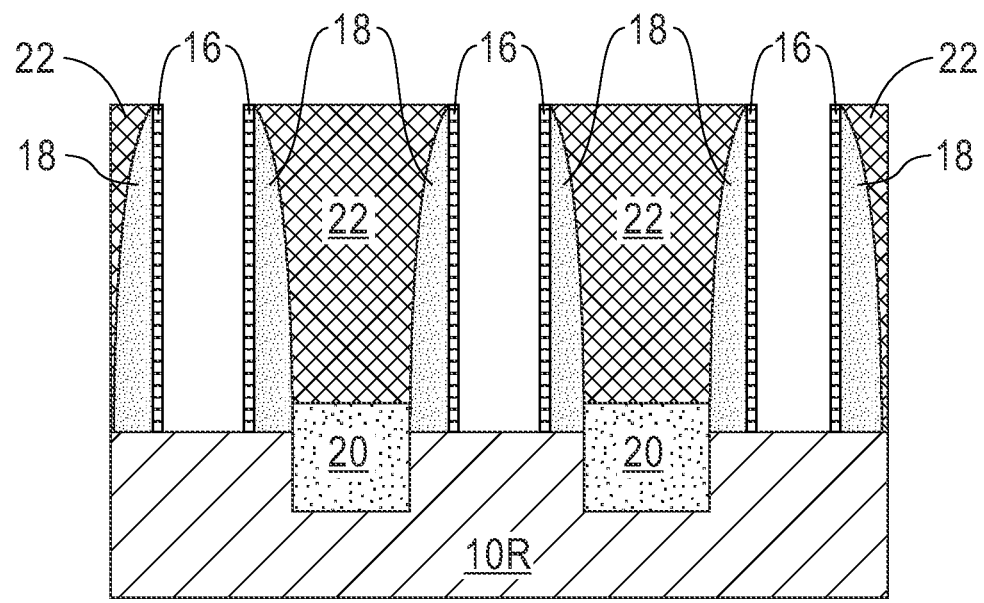
FIG. 6B is a cross sectional view of the exemplary structure shown in FIG. 5B after removing the dielectric oxide layer and the sacrificial gate dielectric material.

Referring now to FIGS. 6A and 6B, there are illustrated the structures shown in FIGS. 5A and 5B, respectively, after forming a protect mask 28 on the dielectric oxide layer 26 that is present in the I/O device region, but not the core logic/SRAM device region, and removing the dielectric oxide layer 26 and the sacrificial gate dielectric material 12 from the core logic/SRAM device region, but not the I/O device region.

The protect mask 28 can include any masking material including for example, an organic planarization layer (OPL) that is a component of a trilayer masking structure that includes the OPL, a SiARC and photoresist. The protect mask 28 can be formed by deposition, lithographic patterning and etching. During the etching step, all remaining photoresist and SiARC are removed. Other masking materials can also be used for the protect mask 28 besides OPL as exemplified herein.

With the protect mask 28 covering the I/O device region as shown in FIG. 6A, the dielectric oxide layer 26 and the sacrificial gate dielectric 12 can be removed from the core logic/SRAM device region utilizing one or more etching processes (dry etching and/or chemical wet etching). In one example, the dielectric oxide layer 26 and the sacrificial gate dielectric 12 can be removed from the core logic/SRAM device region by utilizing hydrofluoric acid as a wet etchant. The removal of the dielectric oxide layer 26 and the sacrificial gate dielectric 12 physically exposes a portion of the semiconductor fin 10R in the core logic/SRAM device region. The removal of the dielectric oxide layer 26 and the sacrificial gate dielectric 12 also physically exposes the dipole material spacer 16 as shown in FIG. 6B of the present application.

Figure 7A:
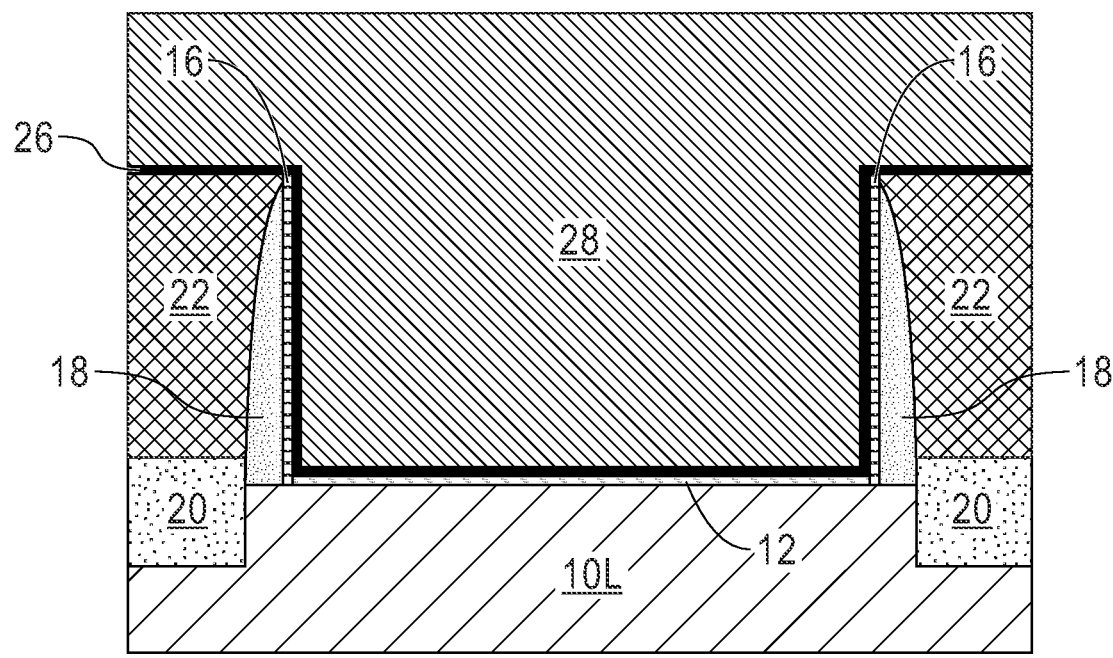
FIG. 7A is a cross sectional view of the exemplary structure show in FIG. 6A and during further processing of the exemplary structure in the core logic/SRAM device region as shown in FIG. 7B.
Figure 7B:
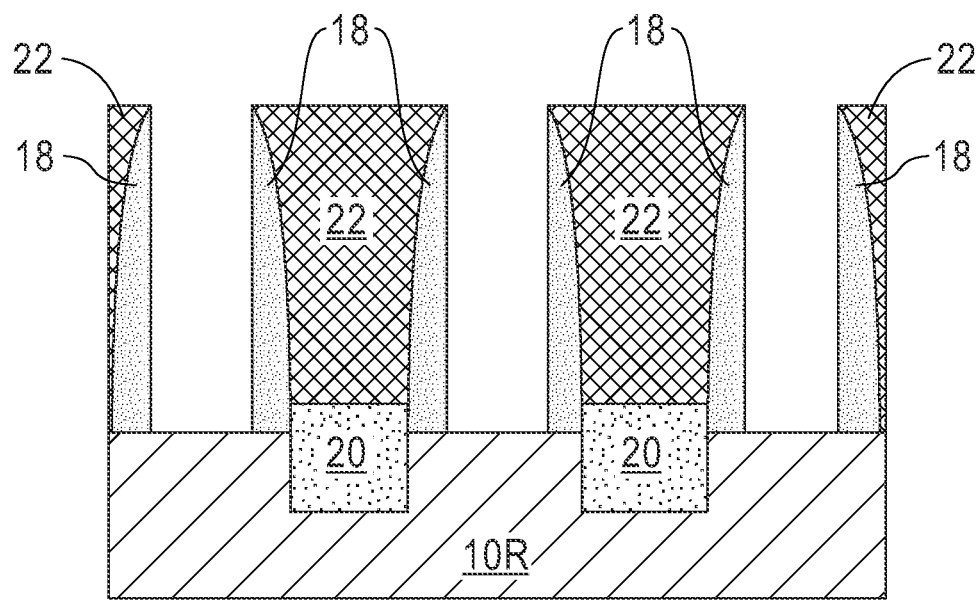
FIG. 7B is a cross sectional view of the exemplary structure shown in FIG. 6B after removing the dipole material spacer.

Referring now to FIGS. 7A and 7B, there are shown the exemplary structures show in FIGS. 6A and 6B, during further processing of the exemplary structure in the core logic/SRAM device region as shown in FIG. 7B; the I/O device area as shown in FIG. 7A still includes the protect mask 28 during the further processing that takes place in the core logic/SRAM device region. Notably, and as is shown in FIG. 7B, the dipole material spacer 16 is removed from the sidewall of the dielectric spacer 18. The removal of the dipole material spacer 16 in the core logic/SRAM device region can include an etch back process. In one example, the etch back process can include etching in HCl. It is noted that the etch back process does not remove an entirety of the dipole material from along the sidewalls of the dielectric spacer 18 in the core logic/SRAM device region. Instead, a trace amount of the dipole material can remain randomly distributed along the sidewalls of the dielectric spacer 18 in the core logic/SRAM device region. This trace amount of the dipole material is present along an interface between the dielectric spacer 18 and the functional gate structure shown in FIGS. 9B and 10B. The trace amount of dipole material can be detected by elemental analysis as mentioned above.

Figure 8A:
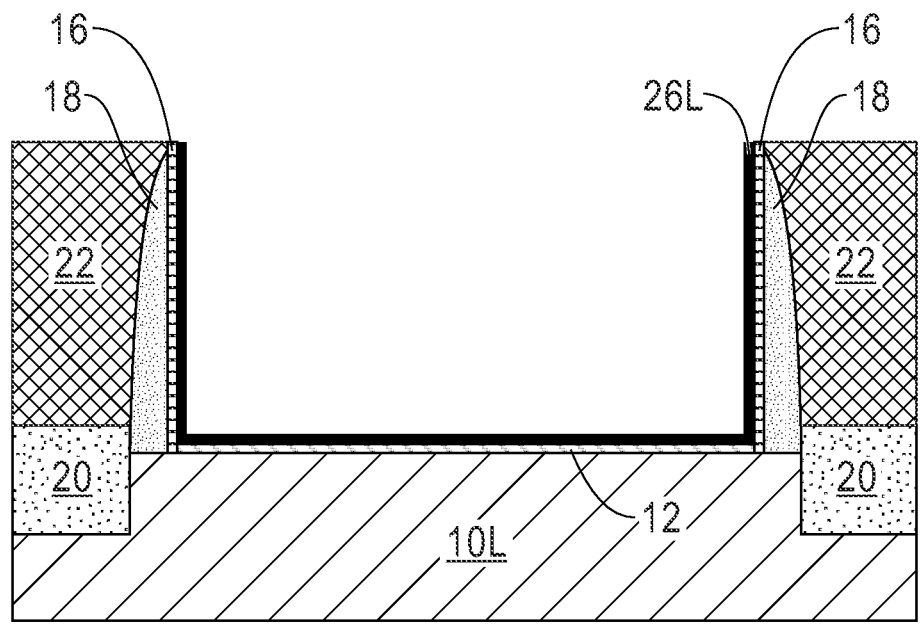
FIG. 8A is a cross sectional view of the exemplary structure shown in FIG. 7A after removing the protect mask and removing the dielectric oxide layer from a topmost surface of the interlayer dielectric material layer.
Figure 8B:
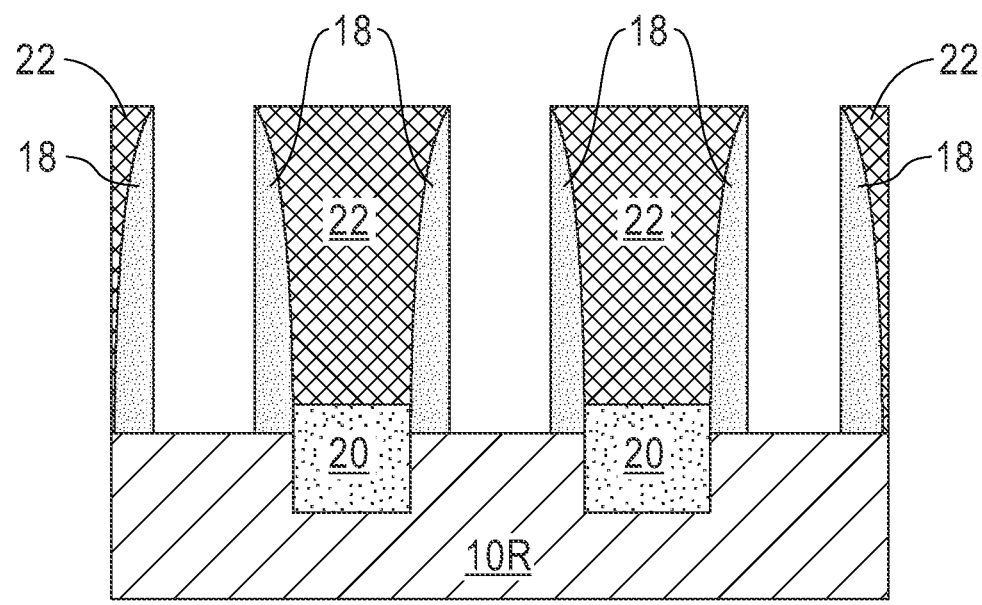
FIG. 8B is a cross sectional view of the exemplary structure shown in FIG. 7B and during further processing of the I/O device region as shown in FIG. 8A.

Referring now to FIGS. 8A and 8B, there are illustrated the exemplary structures shown in FIGS. 7A and 7B, respectively after removing the protect mask 28 from the I/O device region and removing the dielectric oxide layer 26 from a topmost surface of the interlayer dielectric material layer 22 in the I/O device region; note that the exemplary structure shown in FIG. 8B is not effected during these steps of the present application.

The removal of the protect mask 28 from the I/O device region can include any mask removal process that is well known to those skilled in the art. The removal of the dielectric oxide layer 26 from a topmost surface of the ILD material layer 22 in the I/O device region can be performed utilizing a planarization process such as, for example, CMP. As is shown in FIG. 8A, the dielectric oxide layer 26 remains in the opening 24 that is present in the I/O device region. This remaining dielectric oxide layer 26 can be referred to as a dielectric oxide liner 26L. Dielectric oxide liner 26L is U-shaped. By "U-shaped", it is meant that a material has a horizontal portion and a vertical portion extending from each end of the horizontal portion.

Figure 9A:
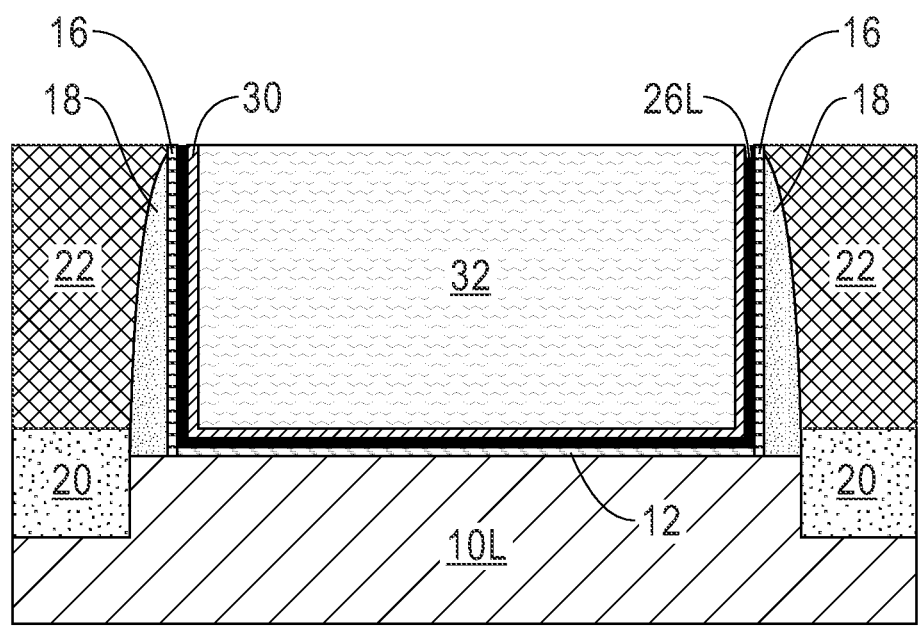
FIG. 9A is a cross sectional view of the exemplary structure shown in FIG. 8A after forming a functional gate structure including at least a gate dielectric material layer and a gate electrode.
Figure 9B:
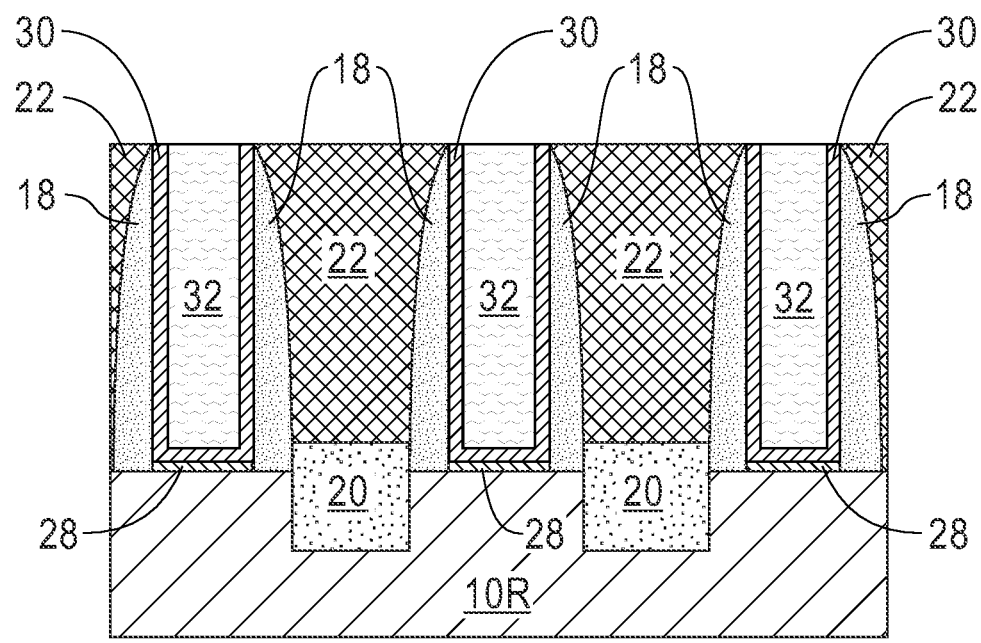
FIG. 9B is a cross sectional view of the exemplary structure shown in FIG. 8B after forming a plurality of functional gate structures, each functional gate structure including at least a gate dielectric material layer and a gate electrode.

Referring now to FIGS. 9A and 9B, there are illustrated the exemplary structure shown in FIGS. 8A-8B, respectively after forming a functional gate structure including at least a gate dielectric material layer 30 and a gate electrode 32. In some embodiments, the functional gate structure includes at least one work function metal (WFM) layer located between the gate dielectric material layer 30 and the gate electrode 32. In some embodiments (not shown), a gate cap is located above a recessed functional gate structure. In other embodiments, a gate cap is omitted.

In the core logic/SRAM region, an interfacial oxide layer 28 can be formed between a bottommost surface of the gate dielectric material layer 30 and the semiconductor fin 10R. The interfacial oxide layer 28 can be formed by a thermal oxidation process or a deposition process. The interfacial oxide layer 28 is a thin layer having a thickness typically from 0.5 nm to 10 nm.

The functional gate structure is a replacement metal gate structure including a gate dielectric material layer 30 that is U-shaped. The gate dielectric material layer 30 is located laterally adjacent each sidewall and a bottom wall of the gate electrode 32. When at least one WFM layer is present, the at least one WFM layer is also U-shaped. In the functional gate structure of the present application, the gate dielectric material layer 30 has a topmost surface that is coplanar with a topmost surface of the gate electrode 32. When at least one WFM layer is present, the gate dielectric material layer 30 has a topmost surface that is coplanar with a topmost surface of both the gate electrode 32 and the at least one WFM layer. In the I/O device region, the dielectric oxide liner 26L has a topmost surface that is coplanar with a topmost surface of each of the gate dielectric material layer 30, the gate electrode 32 and, if present, the at least one WFM layer.

The functional gate structure formation includes forming a continuous layer of gate dielectric material and a gate electrode material inside and outside each opening 24. The continuous layer of gate dielectric material can include silicon oxide, or a dielectric material having a dielectric constant greater than silicon oxide (such dielectric materials can be referred to as a high-k gate dielectric material). Illustrative examples of high-k gate dielectric materials include metal oxides such as, for example, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc,Ta)O_3$), and/or lead zinc niobite ($Pb(Zn,Nb)O$). The high-k gate dielectric material can further include dopants such as lanthanum (La), aluminum (Al) and/or magnesium (Mg). The continuous layer of the gate dielectric material can be formed utilizing a deposition process such as, for example, ALD, CVD, PECVD, or PVD. The continuous layer of the gate dielectric material is a conformal layer having a thickness which can range from 1 nm to 10 nm. The continuous layer of gate dielectric material does not fill in the entirety of each opening 24.

The gate electrode material can include an electrically conductive metal-containing material including, but not limited to tungsten (W), titanium (Ti), tantalum (Ta), ruthenium (Ru), zirconium (Zr), cobalt (Co), copper (Cu), aluminum (Al), lead (Pb), platinum (Pt), tin (Sn), silver (Ag), or gold (Au), tantalum nitride (TaN), titanium nitride (TiN), tantalum carbide (TaCx), titanium carbide (TiC), titanium aluminum carbide, tungsten silicide ($WSi_2$), tungsten nitride (WN), ruthenium oxide ($RuO_2$), cobalt silicide, or nickel silicide. The gate electrode material can be formed utilizing a deposition process such as, for example, ALD, CVD, PECVD, PVD, plating or sputtering. A reflow anneal or a silicide anneal can be used in some embodiments of the present application after conductive metal-containing material deposition has been performed.

In some embodiments, at least one layer of WFM can be formed on the continuous layer of gate dielectric material prior to forming the gate electrode material. In other embodiments, the gate electrode is composed of only the at least one WFM layer. The at least one layer of WFM can be used to set a threshold voltage of the FET to a desired value. In some embodiments, the at least one layer of WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the at least one layer of WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof.

In some embodiments, the at least one layer of WFM is a conformal layer which can be formed by a conformal deposition process such as, for example, ALD, CVD or PECVD. The at least one of WFM layer can have a thickness in the range of 1 nm to 20 nm, although other thickness above or below this range may be used as desired for a particular application.

After forming the continuous layer of the gate dielectric material, the optional at least one layer of WFM and the gate electrode material, a planarization process such as, for example, CMP, is used to remove the continuous layer of the gate dielectric material, the optional layer of WFM and the gate electrode material from outside each opening 24. The remaining continuous layer of the gate dielectric material that is present inside each opening 24 can be referred to as the gate dielectric material layer 30, the remaining optional at least one layer of WFM that is present inside each opening 24 can be referred to as the at least one WFM layer (not shown in the drawings), and remaining gate electrode material that is present inside each opening 24 provides the gate electrode 32. When present, gate cap can be composed of a hard mask material such as, for example, silicon dioxide or silicon nitride. The gate cap can be formed by a deposition process, followed by a planarization process.

Notably, FIG. 9A illustrates a semiconductor structure in accordance with an embodiment of the present application. The exemplary semiconductor structure of FIG. 9A includes a functional gate structure 30, 32 located on a semiconductor channel material structure (i.e., semiconductor fin 10L), wherein the functional gate structure 30, 32 has an outermost sidewall (i.e., the sidewall of the dielectric material layer 30 that is not facing the gate electrode 32) that is substantially perpendicular (i.e., within ±5%) relative to a planar horizontal surface (i.e., the topmost surface) of the semiconductor channel material structure (i.e., the semiconductor fin 10L). The structure further includes source/drain regions 20 located on a surface of the semiconductor channel material structure (i.e., the semiconductor fin 10L) and on either side of the functional gate structure 30, 32, and a dielectric spacer 18 located laterally adjacent to the functional gate structure 30, 32, wherein the dielectric spacer 18 has a vertical sidewall facing the outermost sidewall of the functional gate structure 30, 32. As is shown, the dielectric spacer entirely separates the functional gate structure from the source/drain regions 20. The exemplary structure of FIG. 9A further includes a dipole material spacer 16 located between the outermost sidewall of the functional gate structure 30, 32 and the dielectric spacer 18.

FIG. 9B, which also shows a structure in accordance with the present application, illustrates a second device region (i.e., a logic core/SRAM device region) that is spaced apart from a first device region as shown in FIG. 9A. As shown in FIG. 9B, the second device region includes a second functional gate structure 30, 32 located on a second semiconductor channel material structure (i.e., semiconductor fin 10R), wherein the second functional gate structure 30, 32 has an outermost sidewall (i.e., the sidewall of the gate dielectric material layer 30 not facing the gate electrode 32) that is substantially perpendicular relative to a planar horizontal surface of the second semiconductor channel material structure (i.e., semiconductor fin 10R), second source/drain regions 20 located on a surface of the second semiconductor channel material structure (i.e., the semiconductor fin 10R) and on either side of the second functional gate structure 30, 32, a second dielectric spacer 18 located laterally adjacent to the second functional gate structure 30, 32, wherein the second dielectric spacer 18 has a vertical sidewall facing the outermost sidewall of the second functional gate structure 30, 32 and wherein the second dielectric spacer 18 entirely separates the second functional gate structure 30, 32 from the second source/drain regions 20, and wherein a trace amount of a dipole material is located at an interface between the outermost sidewall of the second functional gate structure and the second dielectric spacer.

Figure 10B:
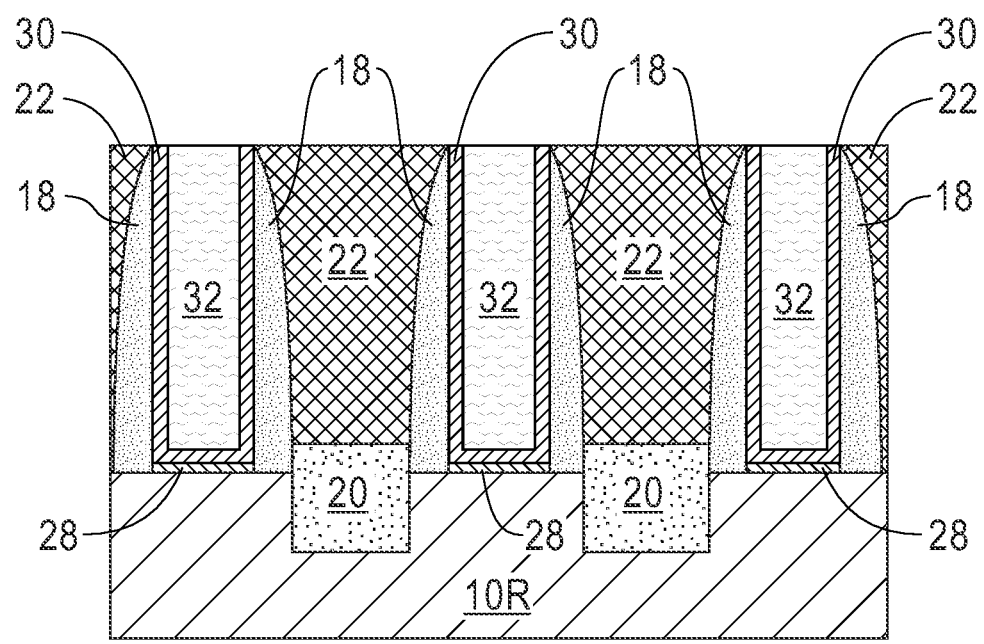
FIG. 10B is a cross sectional view of an exemplary structure present in the core logic/SRAM device region.

Referring now to FIGS. 10A and 10B, there are shown exemplary structures in accordance with another embodiment of the present application. Notably, the exemplary structure shown in FIG. 10A is an embodiment in which the dipole material spacer 16 is removed from the I/O device region, while FIG. 10B illustrates the exemplary structure present in the core logic/SRAM device region. The processing used to provide the exemplary structures shown in FIGS. 10A and 10B is the same as that mentioned above for forming the exemplary structures shown in FIGS. 9A and 9B except that the dipole material spacer 16 is removed from the I/O device region prior to forming the dielectric spacers 18. This removal of the dipole material spacer 16 from the I/O device region was described above as an embodiment of the present application which is performed prior to providing the exemplary structures shown in FIGS. 2A and 2B.

Notably, FIG. 10A illustrates a semiconductor structure in accordance with an embodiment of the present application. The exemplary semiconductor structure of FIG. 10A includes a functional gate structure 30, 32 located on a semiconductor channel material structure (i.e., semiconductor fin 10L), wherein the functional gate structure 30, 32 has an outermost sidewall (i.e., the sidewall of the dielectric material layer 30 that is not facing the gate electrode 32) that is substantially perpendicular (i.e., within ±5%) relative to a planar horizontal surface (i.e., the topmost surface) of the semiconductor channel material structure (i.e., the semiconductor fin 10L). The structure further includes source/drain regions 20 located on a surface of the semiconductor channel material structure (i.e., the semiconductor fin 10L) and on either side of the functional gate structure 30, 32, and a dielectric spacer 18 located laterally adjacent to the functional gate structure 30, 32, wherein the dielectric spacer 18 has a vertical sidewall facing the outermost sidewall of the functional gate structure 30, 32. As is shown, the dielectric spacer entirely separates the functional gate structure from the source/drain regions 20. The exemplary structure of FIG. 10A further includes a trace amount of a dipole is present along the vertical sidewall of the dielectric spacer 18 facing the outermost sidewall of the functional gate structure 30, 32.

FIG. 10B, which also shows a structure in accordance with the present application, illustrates a second device region (i.e., a logic core/SRAM device region) that is spaced apart from a first device region as shown in FIG. 10A. As shown in FIG. 9B, the second device region includes a second functional gate structure 30, 32 located on a second semiconductor channel material structure (i.e., semiconductor fin 10R), wherein the second functional gate structure 30, 32 has an outermost sidewall (i.e., the sidewall of the gate dielectric material layer 30 not facing the gate electrode 32) that is substantially perpendicular relative to a planar horizontal surface of the second semiconductor channel material structure (i.e., semiconductor fin 10R), second source/drain regions 20 located on a surface of the second semiconductor channel material structure (i.e., the semiconductor fin 10R) and on either side of the second functional gate structure 30, 32, a second dielectric spacer 18 located laterally adjacent to the second functional gate structure 30, 32, wherein the second dielectric spacer 18 has a vertical sidewall facing the outermost sidewall of the second functional gate structure 30, 32 and wherein the second dielectric spacer 18 entirely separates the second functional gate structure 30, 32 from the second source/drain regions 20, and wherein a trace amount of a dipole material is located at an interface between the outermost sidewall of the second functional gate structure and the second dielectric spacer.

It is noted that in the exemplary structures shown in FIGS. 9A, 9B, 10A and 10B there is no expanded void that extends into the dielectric spacer 18 which, if present would permit direct physical contact of the functional gate structure 30, 32 with the source/drain regions 20. Instead, zero expanded functional gate structures are formed by utilizing the dipole material spacer 16 as means to prevent expanded void formation during the replacement metal gate process. As such, there is not direct physical contact between the functional gate structures and the source/drain regions in the present application. It is further noted that during the replacement gate process of the present application, not void is formed into the dielectric spacer 18, thus dielectric spacer 18 has maintained its' original shape.

It is also again noted that while the present application describes and illustrated two different device regions, i.e., the I/O device region and the core logic/SRAM device region), the present application work when only one of the two device regions is present.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
  a functional gate structure located on a semiconductor channel material structure, wherein the functional gate structure has an outermost sidewall that is substantially perpendicular relative to a planar horizontal surface of the semiconductor channel material structure;
  source/drain regions located on a surface of the semiconductor channel material structure and on either side of the functional gate structure;
  a dielectric spacer located laterally adjacent to the functional gate structure, wherein the dielectric spacer has a vertical sidewall facing the outermost sidewall of the functional gate structure and wherein the dielectric spacer entirely separates the functional gate structure from the source/drain regions; and
  a dipole material spacer located between the outermost sidewall of the functional gate structure and the dielectric spacer, wherein the dielectric spacer and the dipole spacer both land directly on the semiconductor channel material structure.

2. The semiconductor structure of claim 1, wherein the functional gate structure comprises a gate dielectric material layer and a gate electrode, and wherein the gate dielectric material layer is U-shaped and has a topmost surface that is coplanar with a topmost surface of the gate electrode.

3. The semiconductor structure of claim 2, further comprising a U-shaped dielectric oxide liner located laterally adjacent to, and beneath, the gate dielectric material layer.

4. The semiconductor structure of claim 3, further comprising a sacrificial gate dielectric material located beneath the U-shaped dielectric oxide liner.

5. The semiconductor structure of claim 1, wherein the semiconductor channel material structure is a semiconductor fin.

6. The semiconductor structure of claim 1, further comprising an interlayer dielectric material located laterally adjacent to the dielectric spacer and on the source/drain regions.

7. The semiconductor structure of claim 1, wherein the functional gate structure is present in a first device region that comprises a I/O device region.

8. The semiconductor structure of claim 7, further comprising a second device region spaced apart from the I/O device region, wherein the second device region comprises a second functional gate structure located on a second semiconductor channel material structure, wherein the second functional gate structure has an outermost sidewall that is substantially perpendicular relative to a planar horizontal surface of the second semiconductor channel material structure, second source/drain regions located on a surface of the second semiconductor channel material structure and on either side of the second functional gate structure, a second dielectric spacer located laterally adjacent to the second functional gate structure, wherein the second dielectric spacer has a vertical sidewall facing the outermost sidewall of the second functional gate structure and wherein the second dielectric spacer entirely separates the second functional gate structure from the second source/drain regions, and wherein a trace amount of a dipole material is randomly distributed along an interface between the outermost sidewall of the second functional gate structure and the second dielectric spacer.

9. The semiconductor structure of claim 8, wherein the second device region is a logic core/SRAM device region.

10. The semiconductor structure of claim 8, wherein the second functional gate structure comprises a second gate dielectric material layer and a second gate electrode, and wherein the second gate dielectric material layer is U-shaped and has a topmost surface that is coplanar with a topmost surface of the second gate electrode.

11. The semiconductor structure of claim 10, further comprising an interfacial oxide layer located beneath the second gate dielectric material layer.

12. A semiconductor structure comprising:
  a functional gate structure located on a semiconductor channel material structure, wherein the functional gate structure has an outermost sidewall that is substantially perpendicular relative to a planar horizontal surface of the semiconductor channel material structure;
  source/drain regions located on a surface of the semiconductor channel material structure and on either side of the functional gate structure; and
  a dielectric spacer located laterally adjacent to the functional gate structure, wherein the dielectric spacer has a vertical sidewall facing the outermost sidewall of the functional gate structure and wherein the dielectric spacer entirely separates the functional gate structure from the source/drain regions, and wherein a trace amount of a dipole material is randomly distributed along the vertical sidewall of the dielectric spacer facing the outermost sidewall of the functional gate structure.

13. The semiconductor structure of claim 12, wherein the functional gate structure comprises a gate dielectric material layer and a gate electrode, and wherein the gate dielectric material layer is U-shaped and has a topmost surface that is coplanar with a topmost surface of the gate electrode.

14. The semiconductor structure of claim 13, further comprising a U-shaped dielectric oxide liner located laterally adjacent to, and beneath, the gate dielectric material layer.

15. The semiconductor structure of claim 13, further comprising a sacrificial gate dielectric material located beneath the U-shaped dielectric oxide liner.

16. The semiconductor structure of claim 12, further comprising an interlayer dielectric material located laterally adjacent to the dielectric spacer and on the source/drain regions.

17. The semiconductor structure of claim 12, wherein the functional gate structure is present in a first device region that comprises a I/O device region.

18. The semiconductor structure of claim 17, further comprising a second device region spaced apart from the I/O device region, wherein the second device region comprises a second functional gate structure located on a second semiconductor channel material structure, wherein the second functional gate structure has an outermost sidewall that is substantially perpendicular relative to a planar horizontal surface of the second semiconductor channel material structure, second source/drain regions located on a surface of the second semiconductor channel material structure and on either side of the second functional gate structure, a second dielectric spacer located laterally adjacent to the second functional gate structure, wherein the second dielectric spacer has a vertical sidewall facing the outermost sidewall of the second functional gate structure and wherein the second dielectric spacer entirely separates the second functional gate structure from the second source/drain regions, and wherein a trace amount of a dipole material is randomly distributed along an interface between the outermost sidewall of the second functional gate structure and the second dielectric spacer.

19. The semiconductor structure of claim 18, wherein the second device region is a logic core/SRAM device region.

20. A semiconductor structure comprising:
- a functional gate structure located on a semiconductor channel material structure, wherein the functional gate structure has an outermost sidewall that is substantially perpendicular relative to a planar horizontal surface of the semiconductor channel material structure;
- source/drain regions located on a surface of the semiconductor channel material structure and on either side of the functional gate structure; and
- a dielectric spacer located laterally adjacent to the functional gate structure, wherein the dielectric spacer has a vertical sidewall facing the outermost sidewall of the functional gate structure and wherein the dielectric spacer entirely separates the functional gate structure from the source/drain regions, and wherein a trace amount of a dipole material is randomly distributed along an interface between the outermost sidewall of the functional gate structure and the dielectric spacer.

* * * * *